(12) United States Patent
Mann et al.

(10) Patent No.: US 6,373,306 B1
(45) Date of Patent: *Apr. 16, 2002

(54) CLOCK GENERATOR WITH PROGRAMMABLE TWO-TONE MODULATION FOR EMI REDUCTION

(75) Inventors: Eric N. Mann, Issaquah; Galen E. Stansell, Kirkland; Monte F. Mar, Issaquah, all of WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/689,492

(22) Filed: Oct. 12, 2000

Related U.S. Application Data

(63) Continuation of application No. 09/246,981, filed on Feb. 9, 1999, now Pat. No. 6,175,259.

(51) Int. Cl.[7] .................................................. H03L 7/00
(52) U.S. Cl. ...................... 327/159; 327/150; 327/156; 327/147; 327/131
(58) Field of Search ................................ 327/141, 150, 327/151, 147, 156, 159, 131, 551, 160, 133

(56) References Cited

U.S. PATENT DOCUMENTS

| | | | |
|---|---|---|---|
| 4,496,912 A | * 1/1985 | Wynn | 331/1 A |
| 4,578,649 A | 3/1986 | Shupe | 331/78 |
| 5,148,447 A | 9/1992 | Ito | 375/7 |
| 5,204,877 A | 4/1993 | Endo et al. | 375/1 |
| 5,226,058 A | 7/1993 | Anderson et al. | 375/1 |
| 5,416,434 A | 5/1995 | Kootstra et al. | 327/113 |
| 5,488,627 A | 1/1996 | Hardin et al. | 375/204 |
| 5,491,458 A | 2/1996 | McCune, Jr. et al. | 332/144 |
| 5,610,955 A | 3/1997 | Bland | 375/376 |
| 5,631,920 A | 5/1997 | Hardin et al. | 375/200 |
| 5,651,036 A | * 7/1997 | Hee et al. | 327/164 |
| 5,877,656 A | 3/1999 | Mann et al. | 327/147 |
| 6,175,259 B1 | * 1/2001 | Mann et al. | 327/159 |

FOREIGN PATENT DOCUMENTS

| | | |
|---|---|---|
| EP | 0655829 | 5/1995 |
| EP | 0739089 | 10/1996 |

* cited by examiner

*Primary Examiner*—Dinh T. Le
(74) *Attorney, Agent, or Firm*—Christopher P. Maiorana, P.C.

(57) ABSTRACT

An apparatus comprising a first circuit and a second circuit. The first circuit may be configured to generate an output signal that ramps between a first and second frequency in response to (i) a first control signal, (ii) a second control signal, and (iii) a first reference signal. The second circuit may be configured to generate the first and second control signals in response to a third control signal having a third frequency. The third frequency may reduce electromagnetic interference generated by the first circuit.

20 Claims, 2 Drawing Sheets

CLOCK GENERATOR WITH PROGRAMMABLE TWO-TONE MODULATION FOR EMI REDUCTION

This is a continuation of U.S. Ser. No. 09/246,981, filed Feb. 9, 1999 now U.S. Pat. No. 6,175,259.

FIELD OF THE INVENTION

The present invention relates to clock generators generally and, more particularly, to a clock generator with programmable modulation to reduce EMI.

BACKGROUND OF THE INVENTION

Clock generators are used to generate frequencies used by a variety of devices. When clock generators generate high frequencies (e.g., frequencies created over 100 MHz) high amounts of electromagnetic interference (EMI) may be generated. If the amount of EMI is too high, additional problems, such as data integrity issues, may be introduced in storage devices such as memories. It is therefore desirable to reduce the total amount of EMI generated by a clock generator circuit.

SUMMARY OF THE INVENTION

The present invention concerns an apparatus comprising a first circuit and a second circuit. The first circuit may be configured to generate an output signal that ramps between a first and second frequency in response to (i) a first control signal, (ii) a second control signal, and (iii) a first reference signal. The second circuit may be configured to generate the first and second control signals in response to a third control signal having a third frequency. The third frequency may reduce electromagnetic interference generated by the first circuit or devices connected to the first circuit.

The objects, features and advantages of the present invention include providing a circuit that reduces EMI through use of a clock generator with a programmable two-tone modulation that may be implemented in devices such as a phase-locked loop (PLL).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
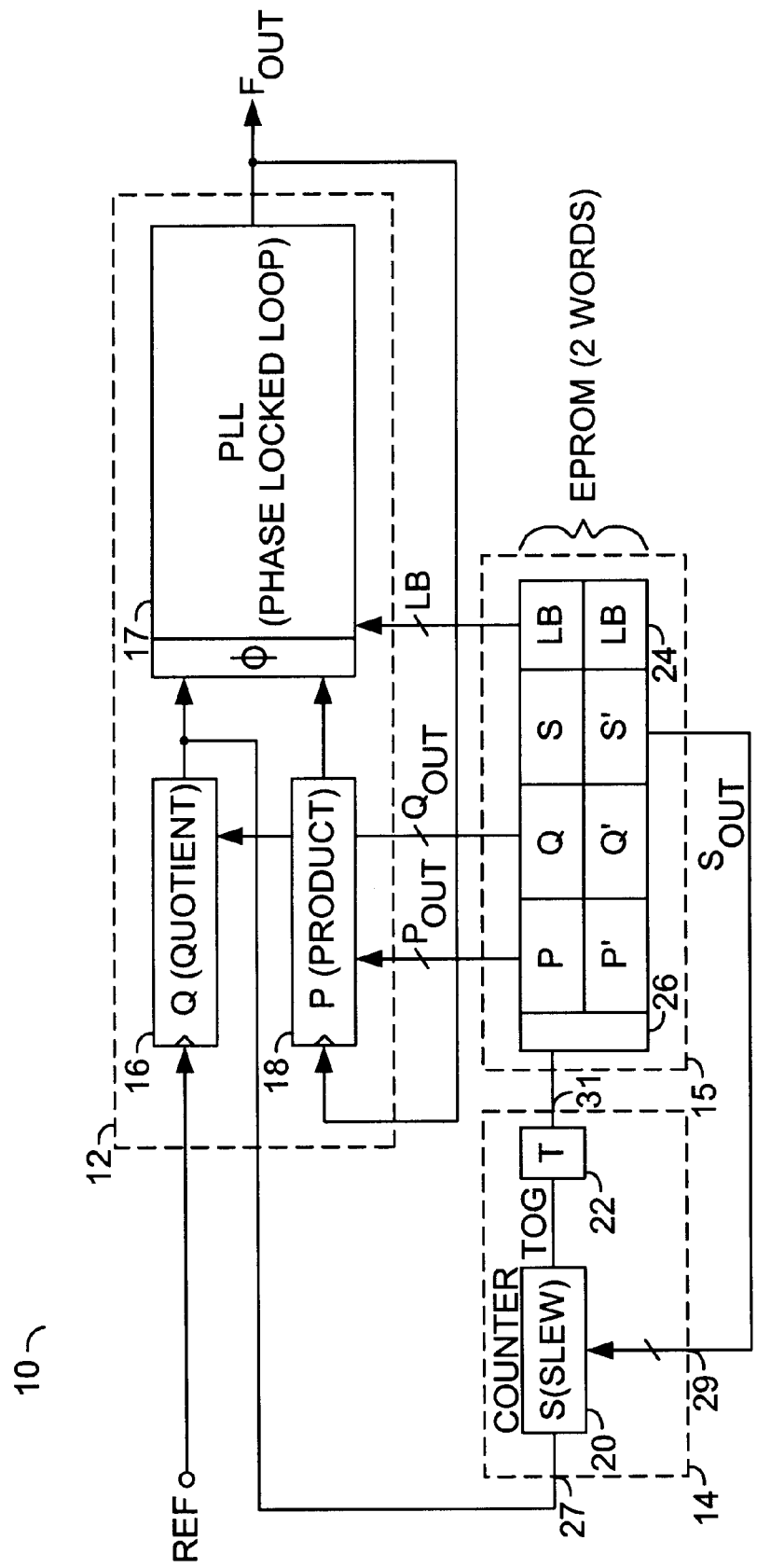
FIG. 1 is a block diagram of an implementation of the present invention in a phase-locked loop (PLL)

Referring to FIG. 1 a block diagram of a circuit 10 is shown in accordance with a preferred embodiment of the present invention. The circuit 10 generally comprises a synthesizer block (or circuit) 12, a counter block (or circuit) 14 and a generator block (or circuit) 15. The synthesizer block 12 generally comprises a counter 16, a phase-locked loop (PLL) block (or circuit) 17, and a counter 18. The counter circuit 16 generally comprises a counter 20 and a flip-flop 22. The generator circuit 15 generally comprises a memory 24 and an address block (or circuit) 26. The counter 16 may be a Q-counter (or quotient counter), the counter 18 may be a P-counter (or a product counter) and the counter 20 may be an S-counter (e.g., a slew counter or a "spread" counter). In one example, the flip-flop 22 may be implemented as a T-type flip-flop. The memory 24 may be implemented, in one example, as a electrically programmable read only memory (EPROM). However, other types of memories may be implemented accordingly to meet the design criteria of a particular application. For example, a small EPROM may be sufficient to provide the functions necessary of the circuit 10. A read-only memory (ROM) electrically erasable programmable read-only memory (EEPROM) or Random Access Memory (RAM) may be implemented accordingly to meet the design criteria of a particular implementation.

The generator circuit 15 may present a control signal or value (e.g., Pout) and a control signal or value (e.g., Qout) to the counter 18 and the counter 16, respectively. The generator circuit 15 may also present a control signal (e.g., Sout) to the S-counter 20. The S-counter 20 generally presents a control signal (e.g., TOG) to the flip-flop 22. The signal TOG is shown presented in response to an output of the counter 16 (generally received at an input 27) and the output Sout (generally received at an input 29). The signal received at the input 27 is generally a divided version of the reference clock signal Ref presented by the counter 16. Alternately, the signal received at the input 27 may be received from the output signal Fout. In another example, the output of the counter 18 may be presented to the input 27 in order to meet the design criteria of a particular application.

The flip-flop 22 generally presents a signal at an output 31 that generally oscillates between two states at a predetermined frequency. The signal presented at the output 31 may be presented to an address decoder 26 that may provide a true and complement version to the memory 24. The frequency may be determined by the output Sout that may oscillate between two values (S and S'). The memory 24 may oscillate between presenting the values P and P', and the values Q and Q' to the counter 18 and the counter 16, respectively. More specifically, a first set of values (e.g., P and Q) may be presented in response to a first state of the signal presented at the output 31 and a second set of outputs (e.g., P' and Q') may be presented in response to a second state of the signal presented at the output 31. Similarly, first value S may be presented to counter 20 in response to a first state of the signal presented at the output 31 and a second value S' may be presented in response to a second state of the signal presented at the output 31.

The signals Pout, Qout and Sout are generally multi-bit signals. Similarly, the control bits LB is generally a multi-bit signal. Additionally, counter 16, the counter 18 and the counter 20 may be implemented as loadable counters. In one example, the signal presented at the output 31 may oscillate at a frequency of approximately 30 khz, which may be referred to as the modulation frequency. The modulation frequency may be adjusted accordingly to meet the design criteria of a particular application. However, it is generally desirable to select a frequency that is above the range of audio perception. Other modulation frequencies may be selected, such as a signal ranging from 20 khz to 100 khz, that may be appropriate in particular design applications. Additionally, higher modulation frequencies may be used. However, the benefit in reducing EMI may have a reduced effect at higher frequencies. In one example, the two tone frequencies may be $f_1 = \text{Ref} \cdot P/Q$ and $f_2 = \text{Ref} \cdot P'/Q'$ with the modulation frequency defined by the following equation EQ1:

$$\frac{Ref}{Q \cdot S + Q' \cdot S'}$$

where Ref is the magnitude of the reference frequency. The PLL generally directed to operate at $f_1$ for a period (Q·S/Ref) and at $f_2$ for a period of (Q'·S'/Ref). Appropriately selecting the loop bandwidth may cause the PLL to ramp in a frequency vs. time graph (to be described in more detail in connection with in FIG. 2) in a generally triangle waveform manner, rather than undergoing rapid frequency changes. The PLL loop bandwidth may be controlled by adjusting the PLL charge pump current, the VCO voltage gain or other appropriate means familiar to those skilled in the art of PLL design. Bandwidth control may be incorporated into the design to facilitate optimizing the triangle waveform for maximum EMI reduction. A number of loop bandwidth control bits (e.g., LB) may be selectable along with the signals P/Q/S or may come from a fixed portion configuration array (e.g., an EPROM or other suitable memory). Additionally, the control bits LB may be fixed, such as through optioning.

Figure 2:
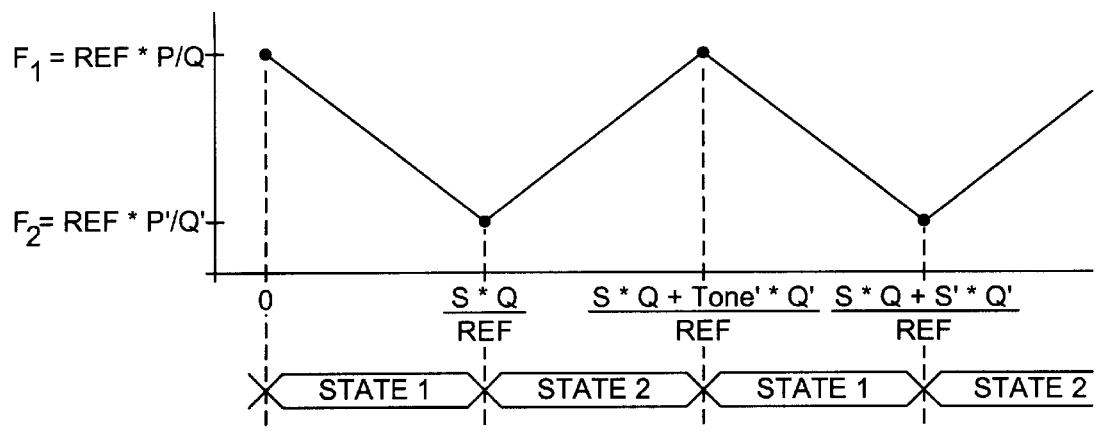
FIG. 2 is a diagram illustrating the modulation domain of a tone generator used in accordance with the preferred embodiment of the present invention.

Referring to FIG. 2, a waveform illustrating the output Fout in a frequency vs. time domain is shown. In general, the signal varies between the frequency f1 and the frequency f2 in a generally triangular type fashion.

The Modulation Index Beta (B) may be equal to the deviation frequency (e.g., $\Delta f_c=(f_1-f_2)/2$) divided by the modulation frequency ($f_m$), i.e., ($\beta=\Delta f_c/f_m$). Thus, by selecting an appropriate modulation frequency and deviation frequency, an appropriate Modulation Index $\beta$ may be selected to reduce EMI by distributing the carrier energy over a large frequency range. The Modulation Index may be proportional to the harmonic of the carrier. For example, the third harmonic of a 100 MHZ carrier has $\beta_{3rd}=3\cdot\beta$fundamental In general, a modulation frequency of about 30 khz may be appropriate to avoid audio effects, and $\Delta f$ approx =0.5%–1% of the carrier frequency, which may result in $\beta\sim8-30$. Harmonic attenuation may typically be in the range of 5–8 dB (e.g., the 7th Harmonic).

Figure 3:
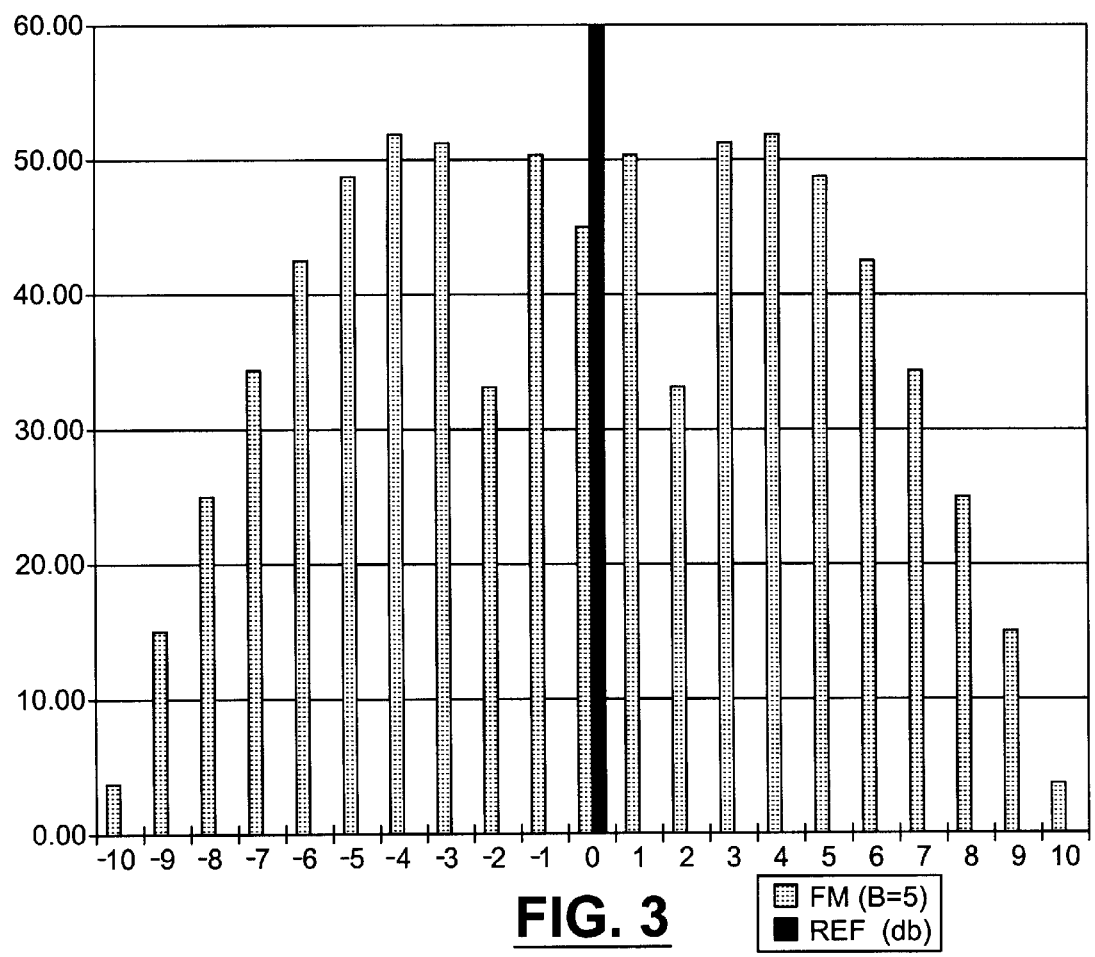
FIG. 3 illustrates a typical EMI distribution of the circuit of FIG. 1.

Referring to FIG. 3, a diagram illustrating the EMI distribution of the present invention is shown. Attenuation (in dB) is approximately proportional to the $LOG_{10}$ of the Modulation Index Beta. Since the digital outputs of clock generators such as PLLs are generally square waves (or, similarly, trapezoidal waveforms), the output spectrum has a number of harmonics. The Modulation Index Beta generally increases since the deviation is proportional to the frequency of the harmonic, while the modulation rate may be constant. For the NTH harmonic, the deviation may be $N*f\Delta$, so $\beta_N=N*\beta_0$. For example, a 50 Mhz clock signal with a +/− 150 khz deviation and a 30 khz modulation frequency may have a Modulation Index of $\beta=5$ and may be attenuated by −8.2 dB. The third harmonic (i.e., 150 Mhz) would have a +/− 450 khz deviation with the same 30 khz frequency, which may result in an index of $\beta=15$ and an attenuation of −11.1 dB. In this example, the high order harmonics are attenuated almost twice as much as the fundamental harmonics in response to the inherent increase of the modulation index. The distribution in FIG. 3 illustrates a spectrum where $A_n$ versus n for $f_n=f_c+n*fm$ for (−10<n<10) of a carrier $f_c$ modulated by a frequency $f_m$ with a Modulation Index of 5. The chart illustrates a maximum amplitude of −9 dB below the unmodulated carrier, and the $10^{th}$ harmonic of the fundamental frequency is −56 dB below the unmodu-lated carrier. If a carrier were modulated with a frequency of 30 khz and modulation index of 5, the maximum deviation from center would be +/− 150 khz. The bandwidth required to pass the FM undistorted is approximately the deviation or 150 khz.

In general, the P-counter and the Q-counter are programmable in response to the value Pout and the value Qout. The present invention may operate by instructing the PLL to switch between two frequencies, where the switching is at a rate derived from the value S as presented in EQ1. The rate of change may be programmed into the memory 15 and may be used to control the programmable counters 16 and 18, respectively. While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate an output signal having an output frequency that ramps between a first frequency and a second frequency in response to (i) a first control signal (ii) a second control signal, and (iii) a first reference signal;
   a second circuit configured to generate said first and second control signals in response to a third control signal derived from said first reference signal, wherein said third control signal reduces electromagnetic interference generated by said first circuit.

2. The apparatus according to claim 1, further comprising:
   a third circuit configured to generate said third control signal in response to (i) said derived first reference signal and (ii) a fourth control signal received from said second circuit.

3. The apparatus according to claim 2, wherein a second reference signal is generated and presented to said first circuit in response to said output signal and oscillates between a first state and a second state at a third frequency.

4. The apparatus according to claim 2, wherein said second reference signal is externally generated.

5. The apparatus according to claim 2, wherein said first circuit further comprises a counter configured to generate said second reference signal in response to said output signal.

6. The apparatus according to claim 3, wherein said first circuit further comprises a counter configured to divide said output signal in response to said first or second control signal to generate said second reference signal.

7. The apparatus according to claim 1, wherein said first circuit comprises a phase-locked loop.

8. The apparatus according to claim 1, wherein said first circuit is configured to achieve frequency synthesis on said output signal.

9. The apparatus according to claim 1, wherein said third control signal comprises a modulation signal.

10. The apparatus according to claim 1, wherein said second frequency is offset from said first frequency.

11. The apparatus according to claim 1, wherein said third control signal has a third frequency much less than said first and second frequencies.

12. The apparatus according to claim 2, wherein said third circuit comprises (i) a counter and (ii) a flip-flop.

13. The apparatus according to claim 1, wherein said second circuit comprises a memory.

14. The apparatus according to claim 1, wherein said first circuit has a loop bandwidth controlled by a fifth control signal, wherein said fifth control signal causes controlled ramping between said first and second frequencies in a triangle waveform.

15. The apparatus according to claim 14, wherein said fifth control signal is generated by said second circuit.

16. The apparatus according to claim 14, wherein said fifth control signal is generated by a memory.

17. The apparatus according to claim 1, wherein said electromagnetic interference is reduced by distributing a carrier energy over a predetermined range of frequencies of said output signal.

18. A circuit comprising:
   means for generating an output signal having an output frequency that ramps between a first frequency and a second frequency in response to (i) a first control signal (ii) a second control signal, and (iii) a first reference signal; and
   means for generating said first and second control signals in response to a third control signal derived from said first reference signal, wherein said third control signal reduces electromagnetic interference generated by said output generating means.

19. A method of reducing electromagnetic interference (EMI) in a frequency generating device comprising the steps of:
   (A) generating first and second control signals in response to a third control signal derived from a reference signal; and
   (B) generating an output signal having an output frequency that ramps between a first frequency and a second frequency in response to said first control signal, said second control signal and said reference signal.

20. The method according to claim 19, wherein said frequency generating device comprises a phase-locked loop.

* * * * *